United States Patent
Chen et al.

(10) Patent No.: US 8,447,048 B2
(45) Date of Patent: May 21, 2013

(54) ELECTRONIC DEVICE, CONTROL VOLUME SYSTEM AND METHOD

(75) Inventors: Po-Hsu Chen, Taipei Hsien (TW); Chien-Tsuen Liu, Taipei Hsien (TW)

(73) Assignee: Wistron Corp., New Taipei (TW)

( * ) Notice: Subject to any disclaimer, the term of this patent is extended or adjusted under 35 U.S.C. 154(b) by 725 days.

(21) Appl. No.: 12/552,296

(22) Filed: Sep. 2, 2009

(65) Prior Publication Data
US 2010/0157172 A1  Jun. 24, 2010

(30) Foreign Application Priority Data
Dec. 22, 2008 (TW) .............................. 97150109 A

(51) Int. Cl.
*H03G 3/00* (2006.01)

(52) U.S. Cl.
USPC .............................. 381/104; 381/28; 381/120

(58) Field of Classification Search
USPC ................. 381/104, 105, 106, 107, 108, 109, 381/110, 119, 120, 28, 79, 57, 314, 84, 102; 700/94; 455/41.1; 386/1; 348/738, 554, E03.049; 379/388.03, 347, 390.03
See application file for complete search history.

(56) References Cited

U.S. PATENT DOCUMENTS

2007/0291955 A1 * 12/2007 Yamashita et al. .............. 381/79
2008/0309830 A1 * 12/2008 Motomura .................... 348/738

FOREIGN PATENT DOCUMENTS

| JP | 10021643 A | * | 1/1998 |
| JP | 2006-108855 | | 4/2006 |
| JP | 2008-294759 | | 12/2008 |

* cited by examiner

*Primary Examiner* — Vivian Chin
*Assistant Examiner* — Leshui Zhang
(74) *Attorney, Agent, or Firm* — CKC & Partners Co., Ltd.

(57) ABSTRACT

In the specification and drawing a control volume system is described and shown for synchronizing a sound volume of an electronic device and another sound volume of the peripheral device according to a volume specification of the electronic device and another volume specification of the peripheral device. Moreover, a control volume method and the electronic device are also disclosed in the specification and drawing.

7 Claims, 2 Drawing Sheets

ELECTRONIC DEVICE, CONTROL VOLUME SYSTEM AND METHOD

RELATED APPLICATIONS

This application claims priority to Taiwan Application Serial Number 97150109, filed Dec. 22, 2008, which is herein incorporated by reference.

BACKGROUND

1. Field of Invention

The present invention relates to a control method, system and equipment. More particularly, the present invention relates to a volume control system and method.

2. Description of Related Art

High-Definition Multimedia Interface (HDMI) provides high definition video/audio and fast transmissions rates, and is simple and easy to be connected to personal computers (PC) and consumer electronics (CE) devices. The continuing adoption of the HDMI specification by manufacturers further strengthens its position as the worldwide standard for high-definition digital connectivity. HDMI can be used in a wide array of products from entry-level devices to high-end home theater systems, including digital televisions, DVD players, set-up boxes and A/V receivers.

In addition, the HDMI specification is experiencing rapid growth in the game console, digital still camera, camcorder, portable media player and PC markets, as manufacturers meet consumer demand for multimedia convergence. Thus, Consumer Electronics Control (CEC) technology has been developed to allow users to command and control multiple CEC-enabled devices with one remote control and for individual CEC-enabled devices to command and control each other without user intervention.

For example, volume control is one commonly employed function in HDMI devices; however, users have to individually control each device with a specific remote control if one of the devices lacks the synchronization feature of CEC, and this is quite inconvenient. In view of the foregoing, there is a need in the related field to provide a means for performing volume synchronization.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one aspect, the present disclosure is directed to a volume control system for performing volume synchronization.

In accordance with an embodiment of the present disclosure, the volume control system comprises an electronic device and a peripheral device. The electronic device comprises an audio generator for providing an audio signal, a memory module for storing a first volume specification and a volume controller; the peripheral device comprises a memory module for storing a second volume specification and a high definition multimedia interface at least one high definition multimedia interface for connecting the electronic device and the peripheral device, wherein the volume controller adjusts the audio signal according to a conversion ratio of the first volume specification to the second volume specification and transmits the adjusted audio signal to the peripheral device via the high definition multimedia interface.

In another aspect, the present disclosure is directed to an electronic device for performing volume synchronization.

In accordance with another embodiment of the present disclosure, the electronic device comprises a high definition multimedia interface, a memory module for storing a first volume specification of the electronic device and a second volume specification of a peripheral device, an audio generator for providing an audio signal corresponding with the first volume specification, and the volume controller for adjusting the audio signal to corresponding with the second volume specification and then transmitting the adjusted audio signal to the peripheral device via the high definition multimedia interface.

In yet another aspect, the present disclosure is directed to a volume control method for performing volume synchronization.

In accordance with yet another embodiment of the present disclosure, the volume control method comprises the following steps: a first volume specification of an electronic device and a second volume specification of a peripheral device are acquired; then, a conversion ratio of the first volume specification to the second volume specification is computed; then, an audio signal in the electronic device is adjusted according to the conversion ratio, and the adjusted audio signal is transmitted to the peripheral device.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Like reference numerals are used to designate like parts in the accompanying drawings.

DESCRIPTION OF THE PREFERRED EMBODIMENTS

Figure 1:
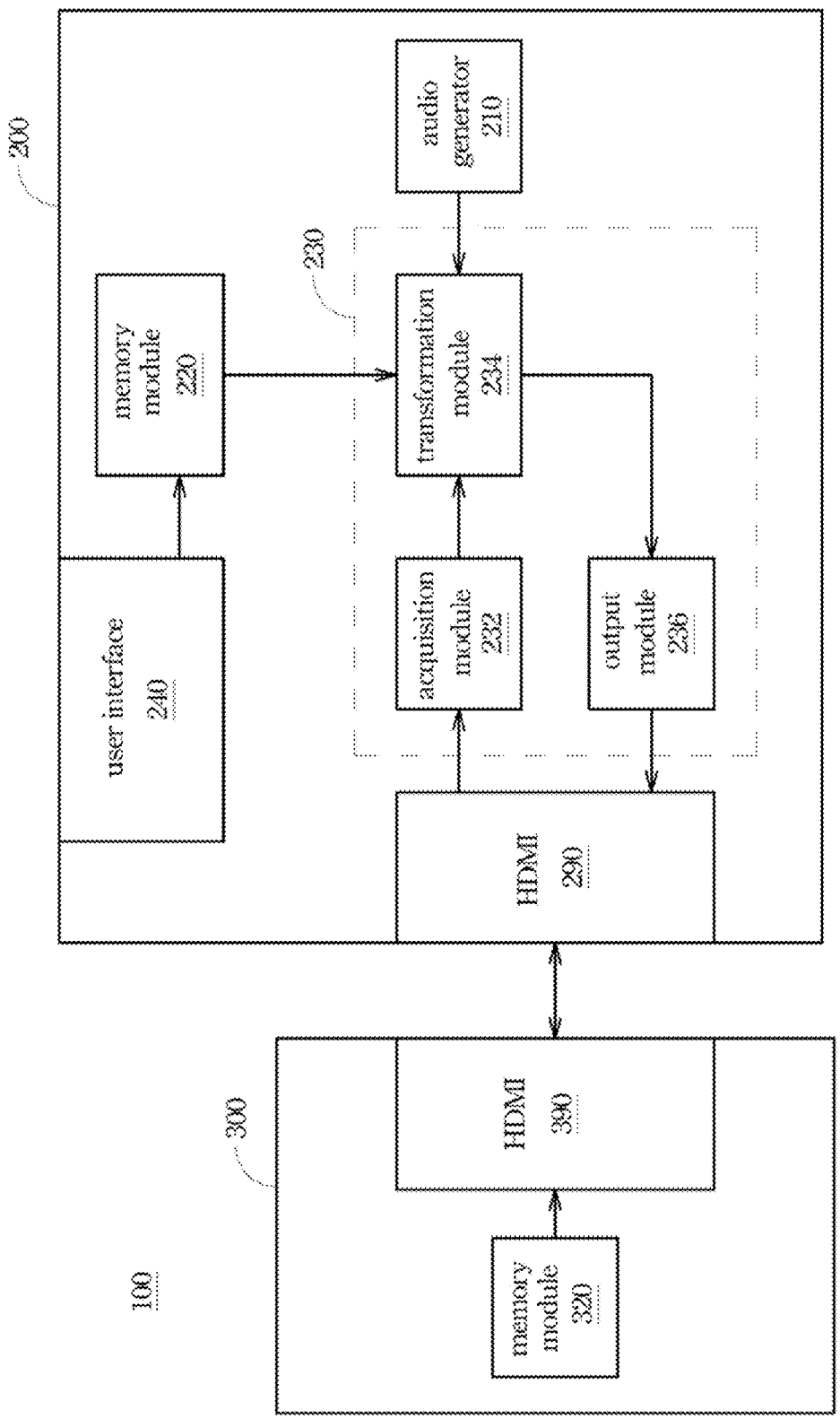
FIG. 1 is a block diagram of a volume control system 100 according to an embodiment of the present disclosure.

Reference will now be made in detail to the present preferred embodiments of the invention, examples of which are illustrated in the accompanying drawings. Wherever possible, the same reference numbers are used in the drawings and the description to refer to the same or like parts.

In one aspect, the present disclosure is directed to a volume control system. The volume control system may be easily inserted into existing devices, such as TV, set top box or the like, and may be applicable or readily adaptable to all technology nodes. It should be noted that the volume control system could perform volume synchronization.

Please refer to FIG. 1. FIG. 1 is a block diagram of a volume control system 100 according to an embodiment of the present disclosure. In FIG. 1, the volume control system 100 comprises an electronic device 200 and a peripheral device 300. The electronic device 200 comprises an audio generator 210, a memory module 220, a volume controller 230 and a high definition multimedia interface (HDMI) 290. The peripheral device 300 comprises a memory module 320 and a high definition multimedia interface (HDMI) 390.

In the electronic device 200, the memory module 220 can store a first volume specification; for example, the first volume specification may comprise software and/or hardware specifications of volume control of the electronic device 200. In the embodiment, the first volume specification comprises a maximum value, a minimum value and a scale value of the sound volume of the electronic device 200.

Similarly, in the peripheral device 300, the memory module 320 can store a second volume specification; for example, the first volume specification may comprise software and/or hardware specifications of volume control of the peripheral device 300. In the embodiment, the second volume specification comprises a maximum value, a minimum value and a scale value of the sound volume of the peripheral device 300.

The memory modules 220 and 320 may be storage elements, so as to be integrated in a chip. One of ordinary skill in the art will appreciate that the above examples are provided for illustrative purposes only to further explain applications of the present invention and are not meant to limit the present invention in any manner. Alternatively, the memories 220,320 may be other software or hardware.

The high definition multimedia interface 290 of the electronic device 200 is electrically connected to the high definition multimedia interface 390 of the peripheral device 300. Accordingly, the high definition multimedia interfaces 290, 390 can connect the electronic device 200 and the peripheral device 300.

The high definition multimedia interface is a compact digital audio/video interface, and it supersedes some analogue connectors, such as SCART and RCA. The high definition multimedia interface provides a common duct of communication for compatible devices, such as set-top boxes, DVD players, personal computers, TV games, sound amplifiers, audio systems and televisions. In the embodiment, the high definition multimedia interfaces 290 and 390 are compact audio/video interfaces for transmitting uncompressed digital data, so as to simplify the installation.

In the electronic device 200, the audio generator 210 can provide an audio signal, wherein the audio signal corresponds with the first volume specification of the electronic device 200. When high definition multimedia interfaces 290 and 390 connect the electronic device 200 and the peripheral device 300, the volume controller 230 can adjusts the audio signal according to a conversion ratio of the first volume specification to the second volume specification and transmits the adjusted audio signal to the peripheral device 300, wherein the adjusted audio signal corresponds with the second volume specification of the peripheral device 300, so as to synchronize a sound volume of the electronic device 200 and a sound volume of the peripheral device 300.

For instance, the electronic device 200 may be a television, and the peripheral device 300 may be a set top box. A user can use a remote control or keys of the television to adjust the volume of the television. If the set top box connects the television through the high definition multimedia interface, the television can transmit the setting thereof to the set top box for performing volume synchronization.

One of ordinary skill in the art will appreciate that the above television and set top box are provided for illustrative purposes only to further explain applications of the present invention and are not meant to limit the present invention in any manner. Alternatively, the electronic device 200 may be inserted in a personal computer, a laptop or the like; the peripheral device 300 may be a television, a tuner, an audio system or the like.

For a more complete understanding of the conversion ratio of the first volume specification to the second volume specification, please refer to following table 1 and table 2.

TABLE 1

| first volume specification | | |
|---|---|---|
| maximum value | minimum value | scale value |
| 28 | 0 | 1 |

TABLE 2

| second volume specification | | |
|---|---|---|
| maximum value | minimum value | scale value |
| 14 | 0 | 1 |

Table 1 shows the maximum value, the minimum value and the scale value of the sound volume in the first volume specification. The sound volume is from 28 to 0, and the scale value is 1. In another word, the sound volume from the maximum value to the minimum value is divided into 28 scales.

Table 2 shows the maximum value, the minimum value and the scale value of the sound volume in the second volume specification. The sound volume is from 14 to 0, and the scale value is 1. In another word, the sound volume from the maximum value to the minimum value is divided into 14 scales.

In table 1 and table 2, the conversion ratio of the sound volume of the first volume specification to the sound volume of the second volume specification is 2:1, and the conversion ratio of the scale value of the first volume specification to the scale value of the second volume specification is 1:1.

One of ordinary skill in the art will appreciate that the above table 1 and table 2 are provided for illustrative purposes only to further explain applications of the present invention and are not meant to limit the present invention in any manner.

The electronic device 200 can provide the audio signal for synchronizing the sound volume of the peripheral device 300 according to the second volume specification of the peripheral device 300. There are at least two ways of getting the second volume specification of the peripheral device 300, wherein the one way is that a user manually operates the user interface 240 to input the second volume specification, and another is that the volume controller 230 automatically gets the second volume specification. The following description considered in connection with the above two ways.

In FIG. 1, the volume controller 230 comprises an acquisition module 232, a transformation module 234 and an output module 236. The acquisition module 232 can acquire the second volume specification from the peripheral device 300; the transformation module 234 can adjust the audio signal according to the conversion ratio of the first volume specification to the second volume specification; the output module 236 can transmit the adjusted audio signal to the peripheral device 300 via the high definition multimedia interface 290, so as to synchronize the sound volume of the electronic device 200 and the sound volume of the peripheral device 300. Accordingly, the volume controller 230 can automatically get the second volume specification to synchronize the sound volume of the electronic device 200 and the sound volume of the peripheral device 300.

Additionally or alternatively, the electronic device 200 comprises a user interface 240. The user interface 240 allows a user to input the second volume specification of the peripheral device 300 and then recording the second volume specification in the memory module 220. Accordingly, the user can manually operate the user interface 240 to input the second volume specification.

For instance, the user interface 240 can use an operational support directive to ask a user the second volume specification of the peripheral device 300; therefore, the memory module 220 can store the second volume specification after the user inputted the second volume specification by the user interface 240.

In practice the user interface 240 may be a graphical user interface so as to facilitate use. One of ordinary skill in the art will appreciate that the above examples are provided for illustrative purposes only to further explain applications of the present invention and are not meant to limit the present invention in any manner. Alternatively, another human-machine interface may be used as appropriate for a given application.

In another aspect, the present disclosure is directed to an electronic device. The electronic device may be easily inserted into existing device, such as TV, set top box or the like, and may be applicable or readily adaptable to all technology nodes. It should be noted that the electronic device could perform volume synchronization.

Please refer to FIG. 1. In FIG. 1, the electronic device 200 the audio generator 210, the memory module 220, the volume controller 230 and the high definition multimedia interface 290.

The memory module 220 can store the first volume specification and the second volume specification. For example, the first volume specification may comprise software and/or hardware specifications of volume control of the electronic device 200; the second volume specification may comprise software and/or hardware specifications of volume control of the peripheral device 300. In the embodiment, the first volume specification comprises a maximum value, a minimum value and a scale value of the sound volume of the electronic device 200; the second volume specification comprises a maximum value, a minimum value and a scale value of the sound volume of the peripheral device 300. In addition, the memory module 320 of the peripheral device 300 can store the second volume specification.

The audio generator 210 can provide an audio signal, wherein the audio signal corresponds with the first volume specification of the electronic device 200. The volume controller 230 can adjusts the audio signal to corresponding with the second volume specification and then transmit the adjusted audio signal to the peripheral device 300 via the high definition multimedia interface 290, so as to synchronize a sound volume of the electronic device 200 and a sound volume of the peripheral device 300.

For a more complete understanding of the conversion ratio of the first volume specification to the second volume specification, please refer to following table 3 and table 4.

TABLE 3

| first volume specification | | |
|---|---|---|
| maximum value | minimum value | scale value |
| 28 | 0 | 1 |

TABLE 4

| second volume specification | | |
|---|---|---|
| maximum value | minimum value | scale value |
| 56 | 0 | 2 |

Table 3 shows the maximum value, the minimum value and the scale value of the sound volume in the first volume specification. The sound volume is from 28 to 0, and the scale value is 1. In another word, the sound volume from the maximum value to the minimum value is divided into 28 scales.

Table 4 shows the maximum value, the minimum value and the scale value of the sound volume in the second volume specification. The sound volume is from 56 to 0, and the scale value is 2. In another word, the sound volume from the maximum value to the minimum value is divided into 28 scales.

In table 3 and table 4, the conversion ratio of the sound volume of the first volume specification to the sound volume of the second volume specification is 1:2, and the conversion ratio of the scale value of the first volume specification to the scale value of the second volume specification is 1:2.

One of ordinary skill in the art will appreciate that the above table 3 and table 4 are provided for illustrative purposes only to further explain applications of the present invention and are not meant to limit the present invention in any manner.

In FIG. 1, the volume controller 230 comprises an acquisition module 232, a transformation module 234 and an output module 236. The acquisition module 232 can acquire the second volume specification from the peripheral device 300 and store the second volume specification in the memory module 220; the transformation module 234 can adjust the audio signal according to the conversion ratio of the first volume specification to the second volume specification; the output module 236 can transmit the adjusted audio signal to the peripheral device 300 via the high definition multimedia interface 290, so as to synchronize the sound volume of the electronic device 200 and the sound volume of the peripheral device 300. Accordingly, the volume controller 230 can automatically get the second volume specification to synchronize the sound volume of the electronic device 200 and the sound volume of the peripheral device 300.

Additionally or alternatively, the electronic device 200 comprises the user interface 240. The user interface 240 can allow a user to input the second volume specification of the peripheral device 300 and then recording the second volume specification in the memory module 220. Accordingly, the user can manually operate the user interface 240 to input the second volume specification.

In another aspect, the present disclosure is directed to a volume control method. The volume control method may be easily inserted into existing device, such as TV, set top box or the like, and may be applicable or readily adaptable to all technology nodes. It should be noted that the volume control method could perform volume synchronization.

Figure 2:
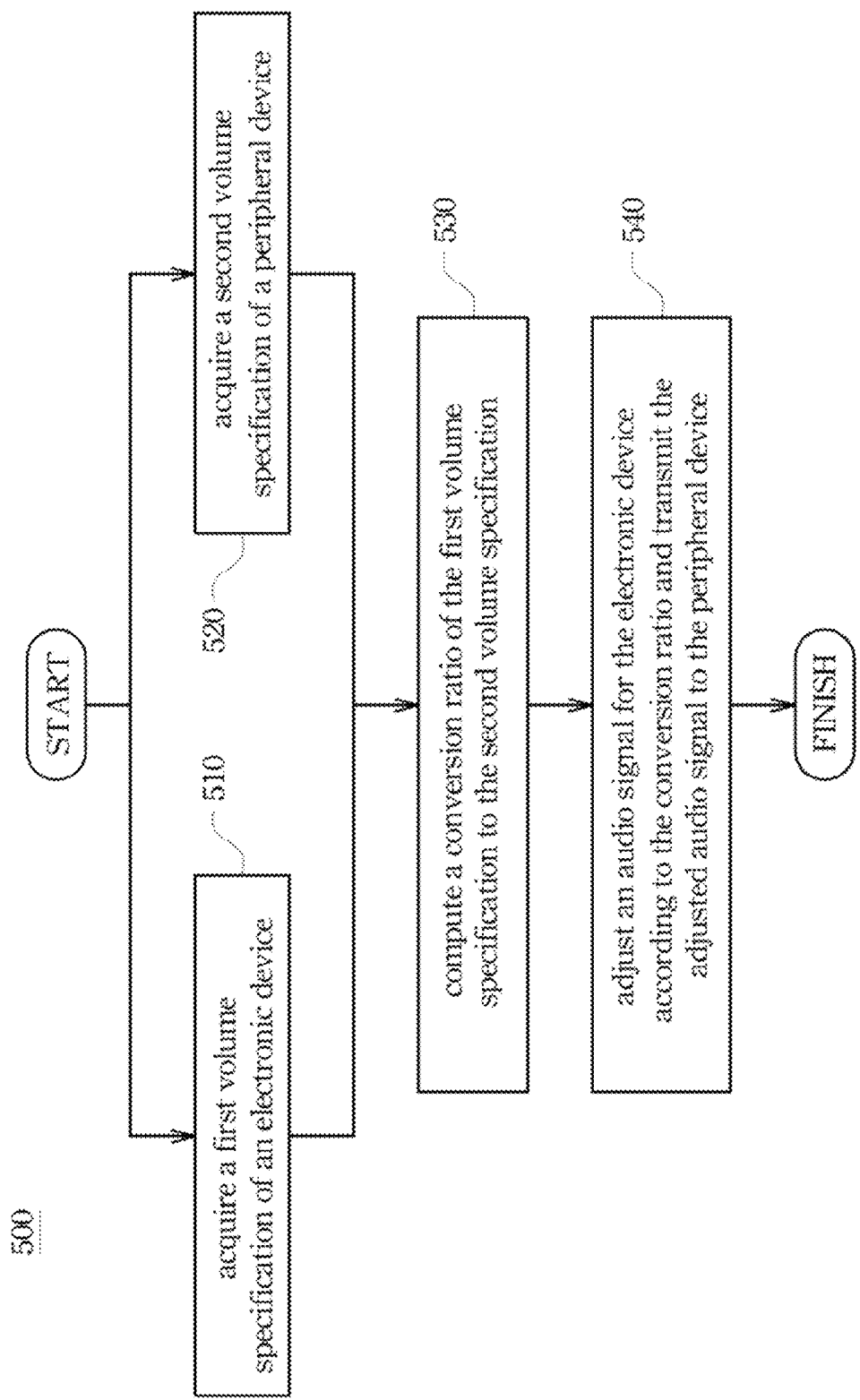
FIG. 2 shows a flow chart of a volume control method 500 according to another embodiment of the present disclosure.

Please refer to FIG. 2. FIG. 2 shows a flow chart of a volume control method 500 according to another embodiment of the present disclosure. The volume control method 500 comprises step 510, step 520, step 530 and step 540. In the volume control method 500, it should be noted that one step might be performed in series, in parallel, in combination, or otherwise in conjunction with another if the specific order is not described or inferred in the embodiment.

In step 510, a first volume specification of an electronic device is acquired; in step 520, a second volume specification of a peripheral device is acquired; in step 530, a conversion ratio of the first volume specification to the second volume specification is computed; in step 540, an audio signal in the electronic device is adjusted according to the conversion ratio, and the adjusted audio signal is transmitted to the peripheral device.

Accordingly, the audio signal corresponds with the first volume specification of the electronic device before adjusted, but the adjusted audio signal corresponds with the second volume specification. Therefore, the adjusted audio signal is transmitted to the peripheral device, so as to synchronize the sound volume of the electronic device and the sound volume of the peripheral device.

In step 510, the first volume specification comprises a maximum value, a minimum value and a scale value of the sound volume of the electronic device. In step 520, the second volume specification comprises a maximum value, a minimum value and a scale value of the sound volume of the peripheral device. In addition, the memory module of the peripheral device can store the second volume specification.

During step 540, the audio signal in the electronic device is adjusted according to the conversion ratio of the first volume specification to the second volume specification, and then the adjusted audio signal is transmitted to the peripheral device via the high definition multimedia interface.

Accordingly, the audio signal may be follow Consumer Electronics Control protocol, so as to synchronously control the sound volume of the electronic device and the sound volume of the peripheral device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A volume control system, comprising:
    an electronic device comprising:
        means for providing an audio signal;
        means for storing a first volume specification of the electronic device wherein the first volume specification comprises a first maximum value, a first minimum value and a plurality of first scale values, wherein a range from the first maximum value to the first minimum value are divided into the first scale values; and
        a volume controller;
    a peripheral device, comprising:
        means for storing a second volume specification of the peripheral device, wherein the second volume specification comprises a second maximum value, a second minimum value and a plurality of second scale values, wherein a range from the second maximum value to the second minimum value are divided into the second scale values; and
        at least one high definition multimedia interface for connecting the electronic device and the peripheral device, wherein the volume controller adjusts the audio signal according to a conversion ratio of the first volume specification to the second volume specification and transmits the adjusted audio signal to the peripheral device via the high definition multimedia interface, wherein the conversion ratio comprises a proportion of the first maximum value to the second maximum value, a proportion of the first minimum value to the second minimum value and a proportion of the first scale value to the second scale value.

2. The volume control system as claimed in claim wherein the volume controller comprises;
    means for acquiring the second volume specification from the peripheral device;
    means for adjusting the audio signal according to the conversion ratio; and
    means for transmitting the adjusted audio signal to the peripheral device via the high definition multimedia interface, so as to synchronize a sound volume of the electronic device and a sound volume of the peripheral device.

3. The volume control system as claimed in claim 1, further comprising:
    means for allowing a user to input the second volume specification of the peripheral device and then recording the second volume specification in the means for storing the second volume specification.

4. A volume control method, comprising steps of:
    (a) acquiring a first volume specification of an electronic device, wherein the first volume specification comprises a first maximum value, a first minimum value and a plurality of first scale values, wherein a range from the first maximum value to the first minimum value are divided into the first scale values;
    (b) acquiring a second volume specification of a peripheral device, wherein the second volume specification comprises a second maximum value, a second minimum value and a plurality of second scale values, wherein a range from the second maximum value to the second minimum value are divided into the second scale values;
    (c) computing a conversion ratio of the first volume specification to the second volume specification; and
    (d) adjusting an audio signal in the electronic device according to the conversion ratio and transmitting the adjusted audio signal to the peripheral device via a high definition multimedia interface, wherein the conversion ratio comprises a proportion of the first maximum value to the second maximum value, a proportion of the first minimum value to the second minimum value and a proportion of the first scale value to the second scale value.

5. A volume control system, comprising:
    an electronic device comprising:
        an audio generator for providing an audio signal;
        a memory module for storing a first volume specification of the electronic device wherein the first volume specification comprises a first maximum value, a first minimum value and a plurality of first scale values, wherein a range from the first maximum value to the first minimum value are divided into the first scale values; and
        a volume controller;
    a peripheral device, comprising:
        a memory module for storing a second volume specification of the peripheral device, wherein the second volume specification comprises a second maximum value, a second minimum value and a plurality of second scale values, wherein a range from the second maximum value to the second minimum value are divided into the second scale values; and
        at least one high definition multimedia interface for connecting the electronic device and the peripheral device, wherein the volume controller adjusts the audio signal according to a conversion ratio of the first volume specification to the second volume specification and transmits the adjusted audio signal to the peripheral device via the high definition multimedia interface, wherein the conversion ratio comprises a proportion of the first maximum value to the second maximum value, a proportion of the first minimum value to the second minimum value and a proportion of the first scale value to the second scale value.

6. The volume control system as claimed in claim 5, wherein the volume controller comprises:
- an acquisition module for acquiring the second volume specification from the peripheral device;
- a transformation module for adjusting the audio signal according to the conversion ratio; and
- an output module for transmitting the adjusted audio signal to the peripheral device via the high definition multimedia interface, so as to synchronize a sound volume of the electronic device and a sound volume of the peripheral device.

7. The volume control system as claimed in claim 5, further comprising:
- a user interface for allowing a user to input the second volume specification of the peripheral device and then recording the second volume specification in the means for storing the second volume specification.

\* \* \* \* \*